United States Patent
Kao et al.

(10) Patent No.: US 12,032,397 B2
(45) Date of Patent: Jul. 9, 2024

(54) LOW DROPOUT REGULATOR WITH AMPLIFIER HAVING FEEDBACK CIRCUIT

(71) Applicant: Realtek Semiconductor Corporation, Hsinchu (TW)

(72) Inventors: Hsueh-Yu Kao, Hsinchu (TW); Yi-Shao Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 115 days.

(21) Appl. No.: 17/471,257

(22) Filed: Sep. 10, 2021

(65) Prior Publication Data
US 2022/0269296 A1 Aug. 25, 2022

(30) Foreign Application Priority Data
Feb. 20, 2021 (TW) .................. 110105972

(51) Int. Cl.
G05F 1/575 (2006.01)
G05F 1/565 (2006.01)
G05F 3/26 (2006.01)

(52) U.S. Cl.
CPC .............. *G05F 1/575* (2013.01); *G05F 1/565* (2013.01); *G05F 3/262* (2013.01)

(58) Field of Classification Search
CPC .. H03F 3/45076; H03F 1/42; H03F 2200/375; G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
See application file for complete search history.

(56) References Cited

U.S. PATENT DOCUMENTS

| | | | | |
|---|---|---|---|---|
| 4,720,686 A | * | 1/1988 | Westwick | ........... H03F 3/45479 330/258 |
| 5,867,048 A | * | 2/1999 | Chou | ....................... H03K 7/08 327/172 |
| 6,107,882 A | * | 8/2000 | Gabara | ............... H03F 3/45237 330/253 |

(Continued)

FOREIGN PATENT DOCUMENTS

| TW | I396063 B | 5/2013 |
|---|---|---|
| TW | I468894 B | 1/2015 |

*Primary Examiner* — Thienvu V Tran
*Assistant Examiner* — Nusrat Quddus
(74) *Attorney, Agent, or Firm* — Locke Lord LLP; Tim Tingkang Xia, Esq.

(57) ABSTRACT

A low dropout regulator includes an output circuit and an amplifier. The output circuit includes a signal input end configured to receive an input voltage and a signal output end configured to output an output voltage. The amplifier includes a first stage amplifier circuit, a second stage amplifier circuit, a first feedback circuit and a second feedback circuit. The first stage amplifier circuit includes a positive output end and a negative output end. The second stage amplifier circuit includes an input end and an output end, wherein the input end and the positive output end are coupled at a first node, and the output end is coupled to the output circuit. The first feedback circuit is coupled between the negative output end and the output end. The second feedback circuit is coupled between the first node and the output end.

19 Claims, 6 Drawing Sheets

(56) References Cited

U.S. PATENT DOCUMENTS

| | | | |
|---|---|---|---|
| 6,522,112 B1* | 2/2003 | Schmoock | G05F 1/575 323/280 |
| 7,183,804 B2* | 2/2007 | Icking | H03K 19/01707 326/26 |
| 7,495,422 B2* | 2/2009 | Mok | G05F 1/575 323/280 |
| 7,834,697 B1* | 11/2010 | Lipka | H03F 3/45475 330/149 |
| RE42,116 E* | 2/2011 | Leung | G05F 1/575 323/280 |
| 7,969,222 B2* | 6/2011 | Bouras | H04B 1/30 327/337 |
| 8,154,263 B1* | 4/2012 | Shi | G05F 1/575 323/280 |
| 9,729,162 B1* | 8/2017 | Yu | H03F 3/45636 |
| 9,927,828 B2* | 3/2018 | Shukla | G05F 3/267 |
| 10,090,815 B2* | 10/2018 | Kumar | H03F 1/0205 |
| 10,705,552 B1* | 7/2020 | Zanchi | H03F 3/45475 |
| 10,831,221 B1* | 11/2020 | Tesch | G05F 1/575 |
| 11,604,490 B1* | 3/2023 | Francis | H03H 11/1213 |
| 2004/0145362 A1* | 7/2004 | Lin | G05F 3/262 323/316 |
| 2005/0184711 A1* | 8/2005 | Chen | G05F 1/575 323/280 |
| 2005/0189930 A1* | 9/2005 | Wu | G05F 1/575 323/280 |
| 2005/0237234 A1* | 10/2005 | Kobayashi | H03M 1/167 341/155 |
| 2006/0197513 A1* | 9/2006 | Tang | G05F 1/575 323/273 |
| 2007/0018621 A1* | 1/2007 | Mok | G05F 1/575 323/280 |
| 2007/0296456 A1* | 12/2007 | van der Goes | H03F 3/45192 326/30 |
| 2008/0180135 A1* | 7/2008 | Fan | H03F 1/26 327/205 |
| 2008/0224768 A1* | 9/2008 | Yen | H03F 3/45183 327/307 |
| 2009/0001953 A1* | 1/2009 | Huang | G05F 1/575 323/281 |
| 2009/0015219 A1* | 1/2009 | Taha | G05F 1/565 323/271 |
| 2009/0085663 A1* | 4/2009 | Yang | H03F 3/45183 327/359 |
| 2009/0195302 A1* | 8/2009 | Lin | H03F 3/505 327/543 |
| 2009/0315468 A1* | 12/2009 | Wu | H05B 45/38 315/186 |
| 2010/0066320 A1* | 3/2010 | Dasgupta | G05F 1/56 323/273 |
| 2010/0213917 A1* | 8/2010 | Pulijala | G05F 1/575 323/293 |
| 2010/0244961 A1* | 9/2010 | Saigusa | H03F 3/45183 330/253 |
| 2011/0068758 A1* | 3/2011 | Chiu | G05F 1/575 323/280 |
| 2011/0102081 A1* | 5/2011 | Su | H03F 1/523 330/252 |
| 2012/0207331 A1* | 8/2012 | Hu | H03F 3/187 330/253 |
| 2012/0280667 A1* | 11/2012 | Drebinger | G05F 1/575 323/273 |
| 2014/0091775 A1* | 4/2014 | Tan | G05F 1/575 323/280 |
| 2014/0225580 A1* | 8/2014 | Carbonini | G05F 1/575 323/280 |
| 2014/0266104 A1* | 9/2014 | El-Nozahi | G05F 1/575 323/280 |
| 2014/0300332 A1* | 10/2014 | Ganta | G05F 1/56 323/273 |
| 2015/0015332 A1* | 1/2015 | Kronmueller | G05F 1/56 330/254 |
| 2015/0198959 A1* | 7/2015 | Kuttner | H03F 3/45071 323/273 |
| 2016/0087592 A1* | 3/2016 | Nan | H03F 1/301 330/277 |
| 2016/0187902 A1* | 6/2016 | Zeng | G05F 1/575 323/280 |
| 2016/0308497 A1* | 10/2016 | Park | G05F 1/625 |
| 2017/0003699 A1* | 1/2017 | Lin | G05F 1/575 |
| 2017/0019078 A1* | 1/2017 | Galal | H03F 3/45475 |
| 2017/0242449 A1* | 8/2017 | Chen | G05F 1/575 |
| 2017/0308497 A1* | 10/2017 | Willey | H03M 13/09 |
| 2018/0120879 A1* | 5/2018 | Du | G05F 1/575 |
| 2018/0329443 A1* | 11/2018 | Chen | H03F 1/301 |
| 2019/0356271 A1* | 11/2019 | Amorosa | H03F 3/45179 |
| 2020/0159267 A1* | 5/2020 | Nedovic | G05F 1/575 |
| 2021/0080987 A1* | 3/2021 | Rodriguez | H02M 3/157 |
| 2021/0303014 A1* | 9/2021 | Migliavacca | G05F 1/575 |
| 2021/0320635 A1* | 10/2021 | Altan | G05F 1/565 |
| 2022/0137656 A1* | 5/2022 | Vangara | G05F 1/575 323/280 |
| 2022/0166391 A1* | 5/2022 | Hong | H03F 3/303 |
| 2022/0269296 A1* | 8/2022 | Kao | H03F 3/45237 |
| 2023/0205245 A1* | 6/2023 | Zhu | G05F 1/468 323/280 |

* cited by examiner

LOW DROPOUT REGULATOR WITH AMPLIFIER HAVING FEEDBACK CIRCUIT

CROSS-REFERENCE TO RELATED APPLICATION

This application claims priority to Taiwan Application Serial Number 110105972, filed Feb. 20, 2021, which is herein incorporated by reference in its entirety.

BACKGROUND

Field of Invention

This disclosure relates to a low dropout regulator, and in particular to a low dropout regulator has the improved power supply rejection ratio (PSRR).

Description of Related Art

Most of the conventional low dropout regulators are implemented by utilizing the folded cascade operation amplifier or the two-stage operation amplifier. However, the frequency bandwidth of the above-described operation amplifier is difficult to increase. Even if the frequency bandwidth is increased, the above-described operation amplifier is easy to be unstable due to the smaller phase margin, so as to affect the power supply rejection ratio of the conventional operation amplifier. Therefore, it is necessary to improve the conventional operation amplifier.

SUMMARY

An aspect of present disclosure relates to a low dropout regulator. The low dropout regulator includes an output circuit and an amplifier. The output circuit includes a signal input end and a signal output end, wherein the signal input end is configured to receive an input voltage, and the signal output end is configured to output an output voltage. The amplifier includes a first stage amplifier circuit, a second stage amplifier circuit, a first feedback circuit and a second feedback circuit. The first stage amplifier circuit includes a positive input end, a negative input end, a positive output end and a negative output end. The second stage amplifier circuit includes an input end and an output end, wherein the input end and the positive output end are coupled at a first node, and the output end is coupled to the output circuit. The first feedback circuit is coupled between the negative output end and the output end. The second feedback circuit is coupled between the first node and the output end.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
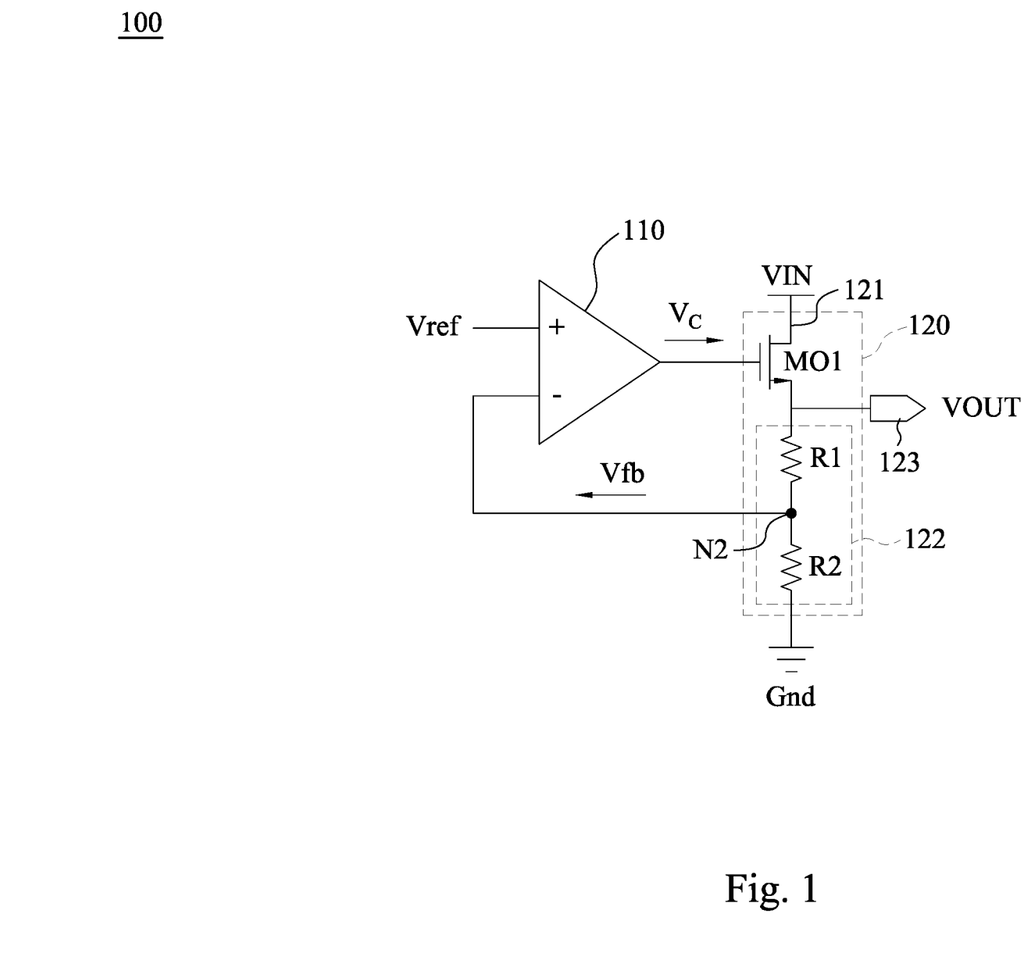
FIG. 1 is a circuit diagram of the low dropout regulator in accordance with some embodiments of the present disclosure.

Referring to FIG. 1, an embodiment of the present disclosure relates to a low dropout regulator 100. The low dropout regulator 100 includes an amplifier 110 and an output circuit 120. The low dropout regulator 100 is configured to receive an input voltage VIN from a voltage source (not shown). The input voltage VIN is unstable. However, the low dropout regulator 100 can convert the input voltage VIN into a stable output voltage VOUT after receiving the input voltage VIN. The amplifier 110 can be implemented by, for example but not limited to, a neutralization operation amplifier.

Figure 2:
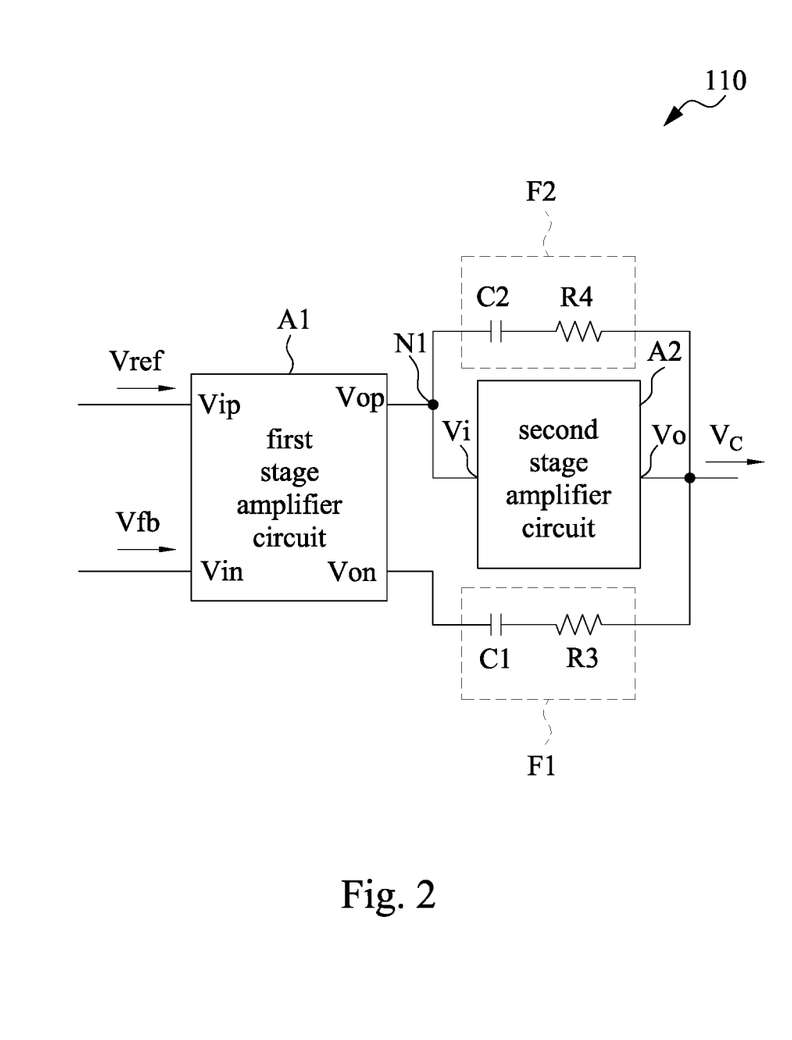
FIG. 2 is a block diagram of an amplifier of the low dropout regulator in accordance with some embodiments of the present disclosure.

Referring to FIG. 2, the amplifier 110 includes a first stage amplifier circuit A1, a second stage amplifier circuit A2, a first feedback circuit F1 and a second feedback circuit F2. The first stage amplifier circuit A1 includes a positive input end Vip, a negative input end Vin, a positive output end Vop and a negative output end Von. The positive input end Vip is configured to receive a reference voltage Vref, and the negative input end Vin is configured to receive a feedback voltage Vfb. The second stage amplifier circuit A2 includes an input end Vi and an output end Vo. The input end Vi and the positive output end Vop are coupled at a node N1, and the output end Vo is coupled to the output circuit 120. The first feedback circuit F1 is coupled between the negative output end Von and the output end Vo, so as to provide the positive feedback. The second feedback circuit F2 is coupled between the node N1 and the output end Vo, so as to provide the negative feedback to the input end Vi of the second stage amplifier circuit A2.

In the present embodiment, the first feedback circuit F1 includes a first capacitor C1 and a third resistor R3. The first capacitor C1 is coupled to the negative output end Von, and the third resistor R3 is coupled between the first capacitor C1 and the output end Vo. The second feedback circuit F2 includes a second capacitor C2 and a fourth resistor R4. The second capacitor C2 is coupled to the node N1, and the fourth resistor R4 is coupled between the second capacitor C2 and the output end Vo. In other words, the second capacitor C2 of the second feedback circuit F2 is coupled to the positive output end Vop of the first stage amplifier circuit A1 and the input end Vi of the second stage amplifier circuit A2.

As shown in FIG. 1 again, the output circuit 120 includes a signal input end 121, a power transistor MO1, a voltage divider circuit 122 and a signal output end 123. The signal input end 121 is configured to receive the input voltage VIN. The signal output end 123 is configured to output the output voltage VOUT. A control terminal (e.g. the gate terminal) of the power transistor MO1 is coupled to the output end Vo of the second stage amplifier circuit A2. A first terminal (e.g. the drain terminal) of the power transistor MO1 is coupled to the signal input end 121. A second terminal (e.g. the source terminal) of the power transistor MO1 is coupled to the signal output end 123.

The voltage divider circuit 122 is coupled to the second terminal of the power transistor MO1, the negative input end Vin of the first stage amplifier circuit A1 and a ground voltage Gnd. The voltage divider circuit 122 is configured to output the feedback voltage Vfb to the negative input end Vin of the first stage amplifier circuit A1 according to the output voltage VOUT.

The voltage divider circuit 122 includes a first resistor R1 and a second resistor R2. The first resistor R1 is coupled between the second terminal of the power transistor MO1 and a node N2. The second resistor R2 is coupled between the node N2 and the ground voltage Gnd. The node N2 is coupled to the negative input end Vin of the first stage amplifier circuit A1, so that the voltage divider circuit 122 can output the feedback voltage Vfb from the node N2 to the negative input end Vin of the first stage amplifier circuit A1.

Figure 3:
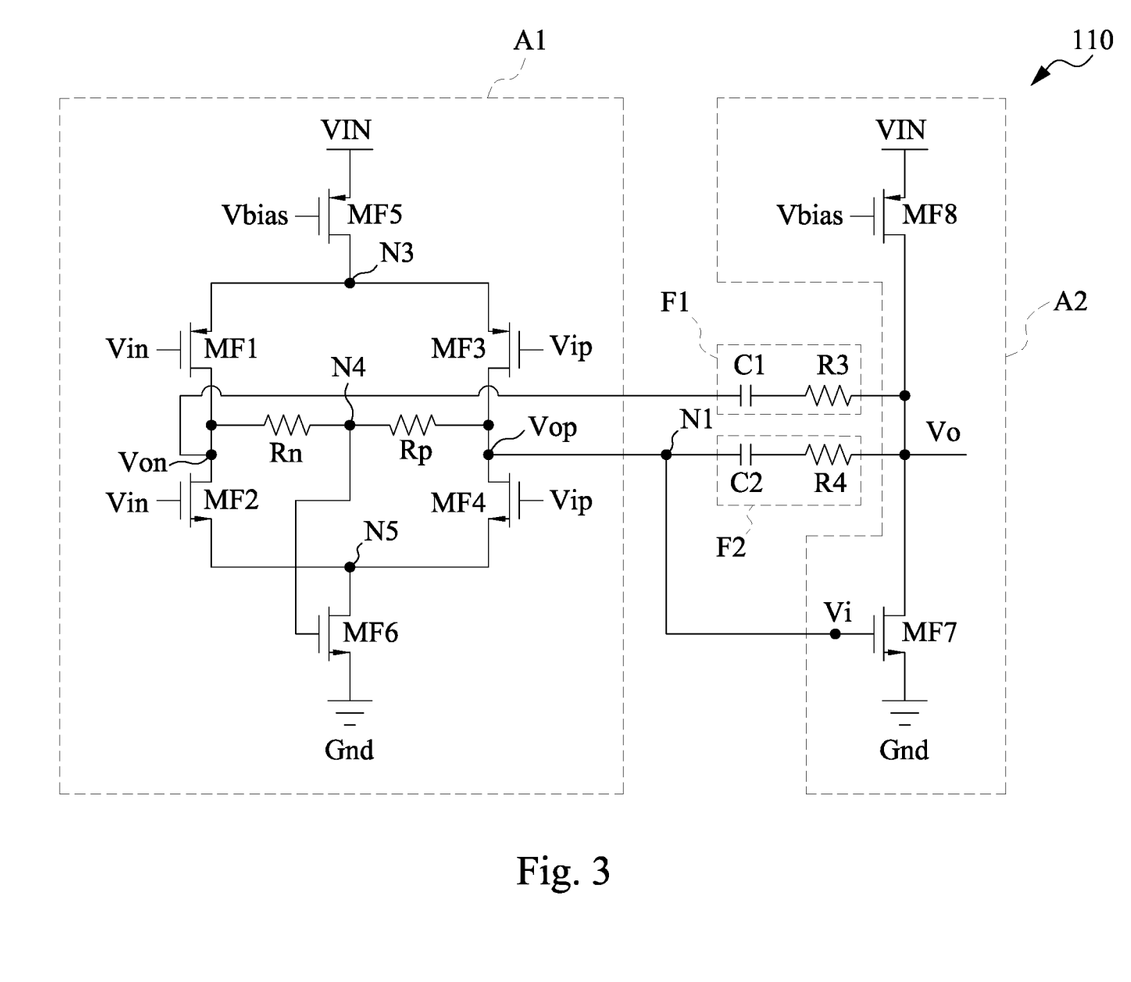
FIG. 3 is a circuit diagram of the amplifier of the low dropout regulator in accordance with some embodiments of the present disclosure.

In the present embodiment, referring to FIG. 3, the first stage amplifier circuit A1 includes a plurality of transistors MF1-MF4, a first bias circuit, a second bias circuit, a positive end resistor Rp and a negative end resistor Rn. The negative input end Vin is coupled to a control terminal of the transistor MF1 and a control terminal of the transistor MF2. The positive input end Vip is coupled to a control terminal of the transistor MF3 and a control terminal of the transistor MF4. A first terminal of the transistor MF1 and a first terminal of the transistor MF2 are coupled to the negative output end Von. A first terminal of the transistor MF3 and a first terminal of the transistor MF4 are coupled to the positive output end Vop. A second terminal of the transistor MF1 and a second terminal of the transistor MF3 are coupled at a node N3. A second terminal of the transistor MF2 and a second terminal of the transistor MF4 are coupled at a node N5.

The first bias circuit is coupled to the node N3, is configured to provide the bias current (not shown) and includes a transistor MF5. A control terminal of the transistor MF5 receives a bias voltage Vbias, a first terminal of the transistor MF5 is coupled to the node N3, and a second terminal of the transistor MF5 receives the input voltage VIN.

The positive end resistor Rp is coupled between the positive output end Vop and a node N4, and the negative end resistor Rn is coupled between the node N4 and the negative output end Von. The second bias circuit is coupled to the node N4 and the node N5 and includes a transistor MF6. A control terminal of the transistor MF6 is coupled to the node N4, a first terminal of the transistor MF6 is coupled to the node N5, and a second terminal of the transistor MF6 receives a ground voltage Gnd.

The second stage amplifier circuit A2 includes a transistor MF7 and a third bias circuit. A control terminal of the transistor MF7 is coupled to the input end Vi, a first terminal of the transistor MF7 is coupled to the output end Vo, and a second terminal of the transistor MF7 is coupled to the ground voltage Gnd.

The third bias circuit is coupled to the first terminal of the transistor MF7 and the output end Vo, is configured to provide the bias current (not shown) and includes a transistor MF8. A control terminal of the transistor MF8 receives the bias voltage Vbias, a first terminal of the transistor MF8 is coupled to the output end Vo, and a second terminal of the transistor MF8 receives the input voltage VIN.

During the operation, when the voltage level of the output voltage VOUT is at a predetermined voltage level (e.g. 3.6 V), the voltage level of the feedback voltage Vfb (e.g. 2.4 V) outputted by the voltage divider circuit 122 is substantially equal to the voltage level of the reference voltage Vref (e.g. 2.4 V).

When the voltage level of the output voltage VOUT is changed (for example, is increased from 3.6 V to 4.2 V), the voltage divider circuit 122 adjusts the voltage level of the feedback voltage Vfb (for example, adjusts from 2.4 V to 2.8 V) according to the change of the output voltage VOUT, so that the voltage level of the feedback voltage Vfb (e.g. 2.8 V) is not equal to the voltage level of the reference voltage Vref (e.g. 2.4 V).

As shown in FIG. 2, the amplifier 110 receives the reference voltage Vref and the feedback voltage Vfb respectively by the positive input end Vip and the negative input end Vin of the first stage amplifier circuit A1. Also, the amplifier 110 outputs a control voltage Vc (as shown in FIG. 1) to the output circuit 120 according to a difference between the voltage level of the reference voltage Vref and the voltage level of the feedback voltage Vfb. The control terminal of the power transistor MO1 of the output circuit 120 receives the control voltage Vc, so as to adjust the voltage level of the output voltage VOUT back to the predetermined voltage level (for example, adjusted from 4.2 V to 3.6 V). In such way, the low dropout regulator 100 can generate the stable output voltage VOUT.

Figure 4:
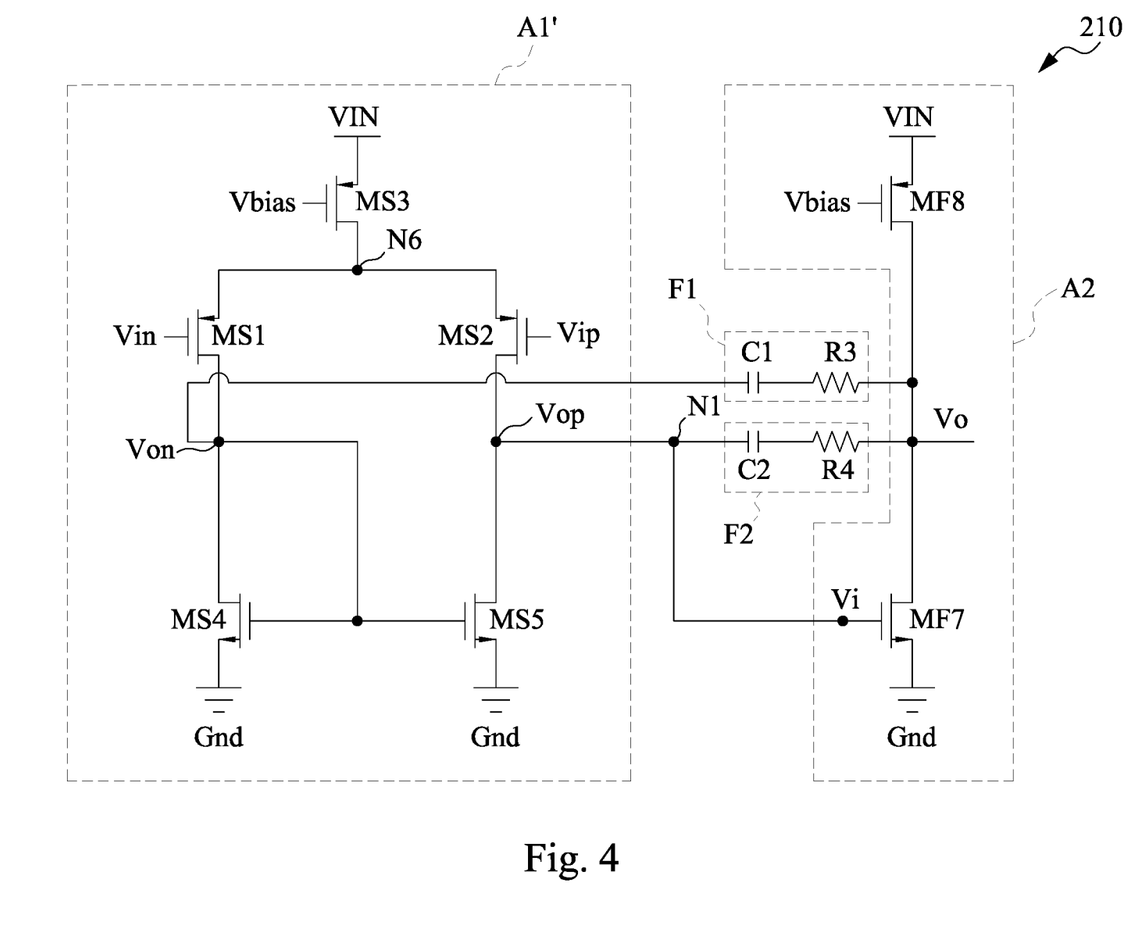
FIG. 4 is a circuit diagram of an amplifier of another low dropout regulator in accordance with other embodiments of the present disclosure.

In another embodiment, the low dropout regulator 100 of the present disclosure is implemented by an amplifier 210 (as shown in FIG. 4) and the output circuit 120 (as shown in FIG. 1). The descriptions of the amplifier 210 similar to those of the amplifier 110 are omitted herein.

Referring to FIG. 4, the first stage amplifier circuit A1' of the amplifier 210 incudes a transistor MS1, a transistor MS2, a first bias circuit and a current mirror circuit. A control terminal of the transistor MS1 is coupled to the negative input end Vin, and a first terminal of the transistor MS1 is coupled to the negative output end Von. A second terminal of the transistor MS1 and a second terminal of the transistor MS2 are coupled at a node N6. A first terminal of the transistor MS2 is coupled to the positive output end Vop, and a control terminal of the transistor MS2 is coupled to the positive input end Vip.

The first bias circuit is coupled to the node N6, is configured to provide the bias current (not shown) and includes a transistor MS3. A control terminal of the transistor MS3 receives the bias voltage Vbias, a first terminal of the transistor MS3 is coupled to the node N6, and a second terminal of the transistor MS3 receives the input voltage VIN.

The current mirror circuit is coupled to the positive output end Vop and the negative output end Von and includes a transistor MS4 and a transistor MS5. A control terminal of the transistor MS4 and a control terminal of the transistor MS5 are coupled to the negative output end Von. A first terminal of the transistor MS4 is coupled to the negative output end Von, and a first terminal of the transistor MS5 is coupled to the positive output end Vop. A second terminal of the transistor MS4 and a second terminal of the transistor MS5 both receive the ground voltage Gnd.

In the above-described embodiment (as shown in FIG. 1), the power transistor MO1 of the low dropout regulator 100 is implemented by N-type metal oxide semiconductor (NMOS). The amplifier 110 receives the reference voltage Vref by the positive input end Vip and receives the feedback voltage Vfb by the negative input end Vin. However, the present disclosure is not limited herein. In other embodiments, the power transistor MO1 can be implemented by P-type metal oxide semiconductor (PMOS) or bipolar junction transistor (BJT). The amplifier 110 can receive the feedback voltage Vfb by the positive input end Vip and can receive the reference voltage Vref by the negative input end Vin.

Figure 5:
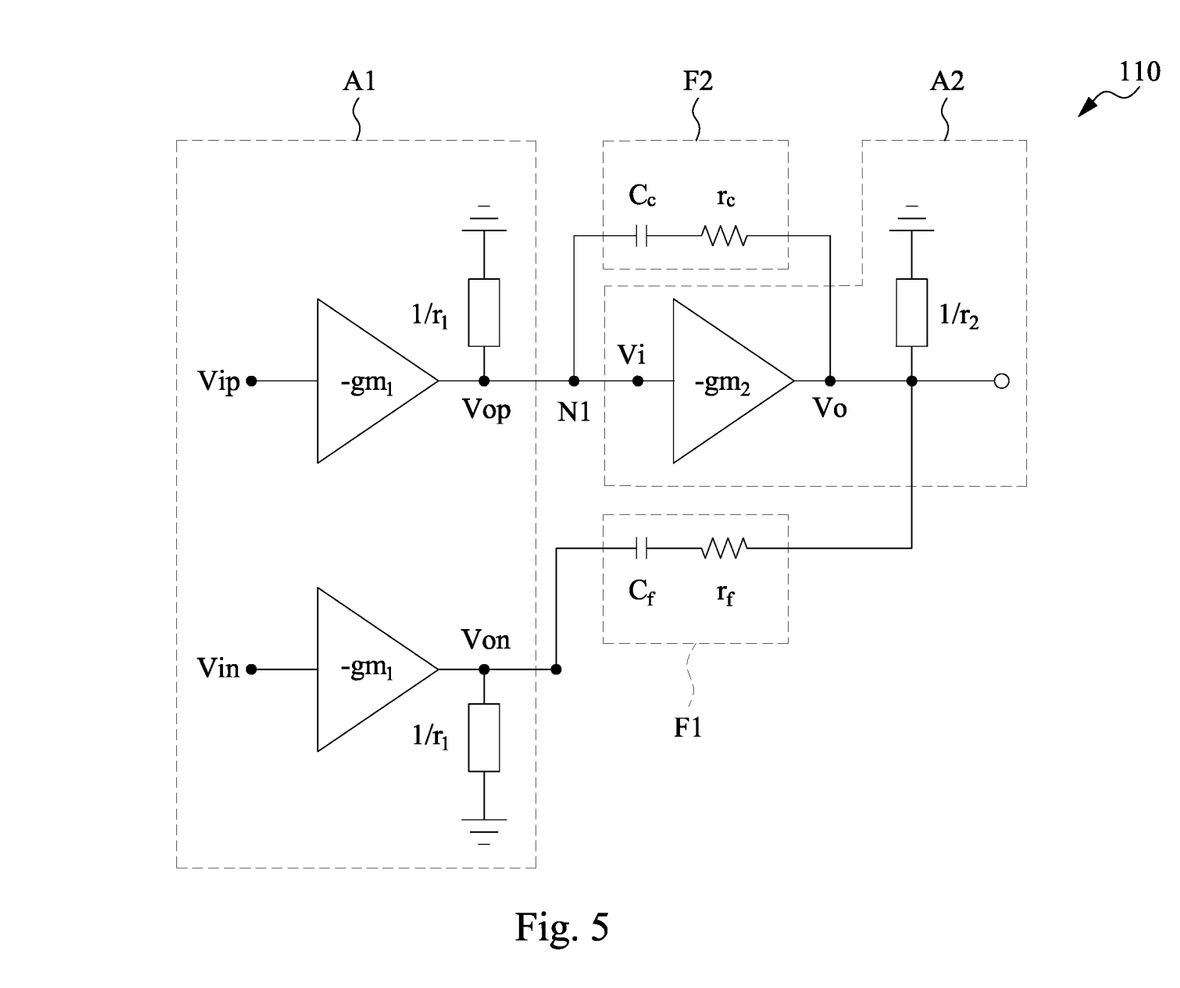
FIG. 5 is a schematic diagram of the small signal equivalent circuit model of the amplifier of the low dropout regulator in accordance with some embodiments of the present disclosure.

Referring to FIG. 5, FIG. 5 illustrates the small signal equivalent circuit model of the amplifier 110 of the present disclosure. By building the small signal equivalent circuit model of the amplifier 110, the transfer function T(s) of the amplifier 110 can be obtained. The transfer function T(s) can be represented as the equation (1):

$$T(s) = \frac{A_1 A_2 (s r_f c_f + 1)(s c_c (r_c^{-1} / gm_2) + 1)}{s^2 A_2 c_c r_1 c_f r_f + s A_2 r_2 (c_c - c_f) + 1}, \quad (1)$$

where $A_1$, $A_2$ are DC gain of the operation amplifier, $r_f$ is the resistance of the third resistor R3, $c_f$ is the capacitance of the first capacitor C1, $r_1$ is the resistance of the fourth resistor R4, $c_c$ is the capacitance of the second capacitor C2, $gm_1$ is the transistor transconductance of the first stage amplifier circuit A1, $gm_2$ is the transistor transconductance of the second stage amplifier circuit A2, $r_1$ is the equivalent resistance of the positive output end Vop or the negative output end Von of the first stage amplifier circuit A1, and $r_2$ is the equivalent resistance of the output end Vo of the second stage amplifier circuit A2.

Figure 6:
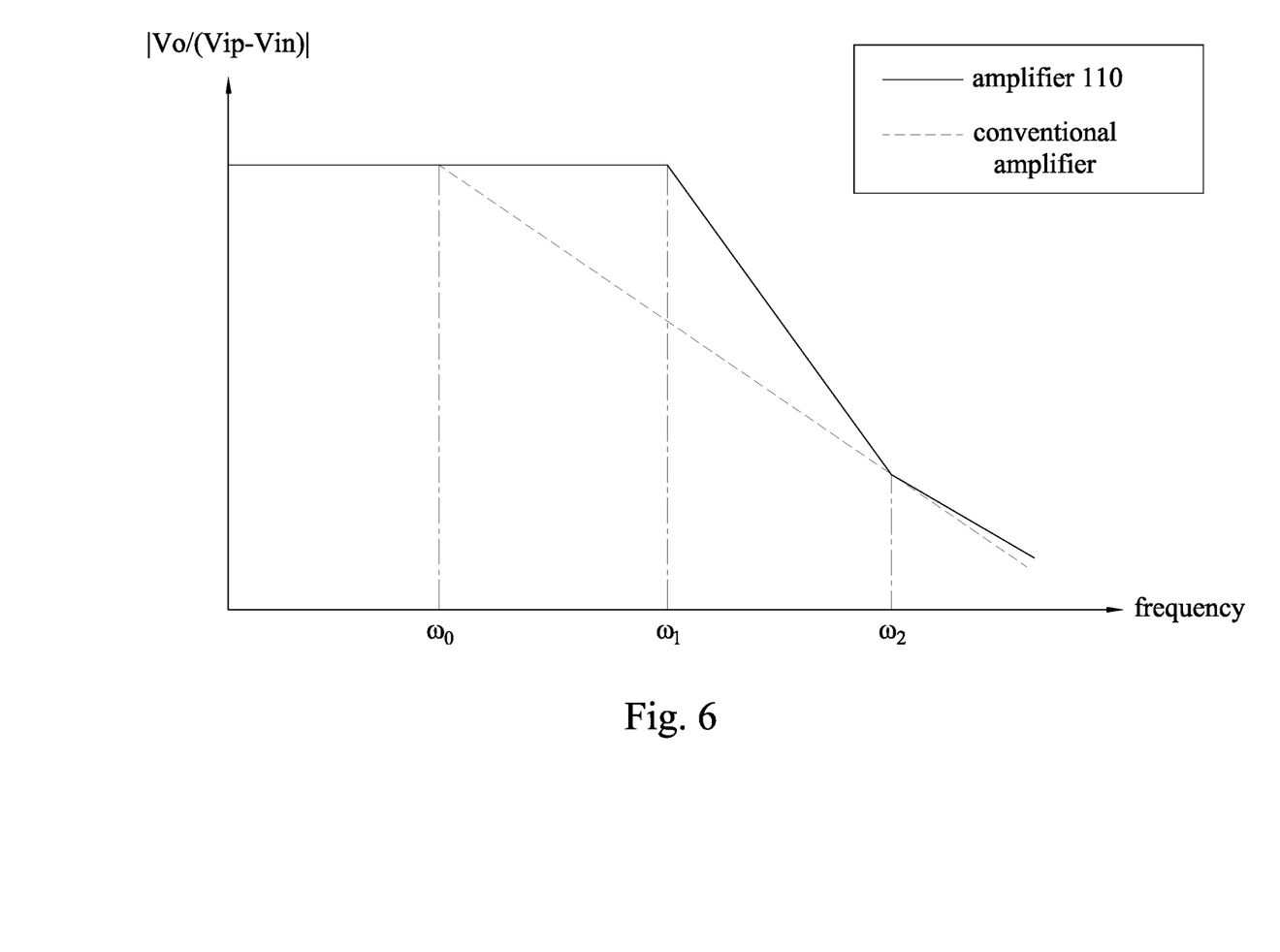
FIG. 6 is a schematic diagram of the frequency response of the amplifier of the low dropout regulator in accordance with some embodiments of the present disclosure.

Referring to FIG. 6, FIG. 6 illustrates the frequency response of the amplifier 110 of the present disclosure (represented by the solid lines) and the conventional amplifier (represented by the broken lines). As shown in FIG. 6, the conventional amplifier has a pole at a first frequency $\omega_0$. The first frequency $\omega_0$ can be represented as the equation (2):

$$\omega_0 = \frac{1}{A_2 c_c r_1} \quad (2)$$

According to the transfer function T(s), a pole of the amplifier 110 of the present disclosure is at a second frequency $\omega_1$, and the amplifier 110 has a zero at a third frequency $\omega_2$. The second frequency $\omega_1$ and the third frequency $\omega_2$ can be respectively represented as the equations (3) and (4):

$$\omega_1 = \sqrt{1/A_2 c_c r_1 c_f r_f} \quad (3)$$

$$\omega_2 = \frac{1}{r_f c_f} \quad (4)$$

According to FIG. 6 and the equations (2)-(4), the frequency bandwidth of the amplifier 110 is increased (as shown in FIG. 6, the second frequency $\omega_1$ is greater than the first frequency $\omega_0$) through the first feedback circuit F1 (including the first capacitor C1 and the third resistor R3) providing the positive feedback. In addition, according to the transfer function T(s), the capacitance $c_e$ of the second capacitor C2 is greater than or equal to the capacitance $c_f$ of the first capacitor C1, and the resistance $r_c$ of the fourth resistor R4 is smaller than the resistance $r_f$ of the third resistor R3. Therefore, the frequency bandwidth of the amplifier 110 is increased.

By increasing the frequency bandwidth of the amplifier 110 through the first feedback circuit F1 providing the positive feedback, the low dropout regulator 100 of the present disclosure is increased in the open-loop gain bandwidth, so as to improve the power supply rejection ratio (PSRR). In such way, the noise can be inhibited.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A low dropout regulator, comprising:
an output circuit comprising a signal input end and a signal output end, wherein the signal input end is configured to receive an input voltage, and the signal output end is configured to output an output voltage; and
an amplifier comprising:
a first stage amplifier circuit comprising a positive input end, a negative input end, a positive output end and a negative output end;
a second stage amplifier circuit comprising an input end and an output end, wherein the input end and the positive output end are coupled at a first node, and the output end is coupled to the output circuit;
a first feedback circuit electrically connected between the negative output end and the output end, and configured to provide a positive feedback, wherein the first feedback circuit comprises a first capacitor and a third resistor, the first capacitor is coupled to the negative output end, and the third resistor is coupled between the first capacitor and the output end; and
a second feedback circuit electrically connected between the first node and the output end.

2. The low dropout regulator of claim 1, wherein the positive input end is configured to receive a reference voltage, the negative input end is configured to receive a feedback voltage, and the amplifier is configured to output a control voltage to the output circuit according to the reference voltage and the feedback voltage, so as to adjust the output voltage.

3. The low dropout regulator of claim 2, wherein the output circuit comprises a power transistor, the output end of the second stage amplifier circuit is coupled to a control terminal of the power transistor, the signal input end is coupled to a first terminal of the power transistor, and the signal output end is coupled to a second terminal of the power transistor.

4. The low dropout regulator of claim 3, wherein the control terminal of the power transistor is configured to receive the control voltage.

5. The low dropout regulator of claim 3, wherein the output circuit further comprises a voltage divider circuit, the voltage divider circuit is coupled to the second terminal of the power transistor, the negative input end of the first stage amplifier circuit and a ground voltage, and the voltage divider circuit is configured to output the feedback voltage to the negative input end of the first stage amplifier circuit according to the output voltage.

6. The low dropout regulator of claim 5, wherein the voltage divider circuit comprises a first resistor and a second resistor, the first resistor is coupled between the second terminal of the power transistor and a second node, the second resistor is coupled between the second node and the ground voltage, and the negative input end of the first stage amplifier circuit is coupled to the second node.

7. The low dropout regulator of claim 2, wherein the first stage amplifier circuit comprises a first transistor, a second transistor, a third transistor and a fourth transistor, the negative input end is coupled to a control terminal of the first transistor and a control terminal of the second transistor, the positive input end is coupled to a control terminal of the third transistor and a control terminal of the fourth transistor, a first terminal of the first transistor and a first terminal of the second transistor are coupled to the negative output end, a first terminal of the third transistor and a first terminal of the fourth transistor are coupled to the positive output end, a second terminal of the first transistor and a second terminal of the third transistor are coupled to a third node, and a second terminal of the second transistor and a second terminal of the fourth transistor are coupled to a fourth node.

8. The low dropout regulator of claim 7, wherein the first stage amplifier circuit further comprises a first bias circuit, a second bias circuit, a positive end resistor and a negative end resistor, the first bias circuit is coupled to the third node, the positive end resistor is coupled between the positive output end and a fifth node, the negative end resistor is coupled between the fifth node and the negative output end, and the second bias circuit is coupled to the fourth node and the fifth node.

9. The low dropout regulator of claim 8, wherein the first bias circuit comprises a fifth transistor, a control terminal of the fifth transistor receives a bias voltage, a first terminal of the fifth transistor is coupled to the third node, and a second terminal of the fifth transistor receives the input voltage.

10. The low dropout regulator of claim 8, wherein the second bias circuit comprises a sixth transistor, a control terminal of the sixth transistor is coupled to the fifth node, a first terminal of the sixth transistor is coupled to the fourth node, and a second terminal of the sixth transistor receives a ground voltage.

11. The low dropout regulator of claim 2, wherein second stage amplifier circuit comprises a seventh transistor and a third bias circuit, the input end is coupled to a control terminal of the seventh transistor, a first terminal of the seventh transistor is coupled to the output end and the third bias circuit, and a second terminal of the seventh transistor is coupled to a ground voltage.

12. The low dropout regulator of claim 11, wherein the third bias circuit comprises an eighth transistor, a control terminal of the eighth transistor receives a bias voltage, a first terminal of the eighth transistor is coupled to the output end, and a second terminal of the eighth transistor receives the input voltage.

13. The low dropout regulator of claim 2, wherein the first stage amplifier circuit comprises a first transistor, a second transistor, a first bias circuit and a current mirror circuit, a control terminal of the first transistor is coupled to the negative input end, a first terminal of the first transistor is coupled to the negative output end, a second terminal of the first transistor and a second terminal of the second transistor are coupled to a sixth node, a first terminal of the second transistor is coupled to the positive output end, a control terminal of the second transistor is coupled to the positive input end, the first bias circuit is coupled to the sixth node, and the current mirror circuit is coupled to the positive output end and the negative output end.

14. The low dropout regulator of claim 13, wherein the first bias circuit comprises a third transistor, a control terminal of the third transistor receives a bias voltage, a first terminal of the third transistor is coupled to the sixth node, and a second terminal of the third transistor receives the input voltage.

15. The low dropout regulator of claim 13, wherein the current mirror circuit comprises a fourth transistor and a fifth transistor, a control terminal of the fourth transistor and a control terminal of the fifth transistor are coupled to the negative output end, a first terminal of the fourth transistor is coupled to the negative output end, a first terminal of the fifth transistor is coupled to the positive output end, and a second terminal of the fourth transistor and a second terminal of the fifth transistor receive a ground voltage.

16. The low dropout regulator of claim 1, wherein the second feedback circuit comprises a second capacitor, the second capacitor is coupled to the first node.

17. The low dropout regulator of claim 16, wherein the second feedback circuit further comprises a fourth resistor, the fourth resistor is coupled between the second capacitor and the output end.

18. The low dropout regulator of claim 17, wherein the resistance of the fourth resistor is smaller than the resistance of the third resistor.

19. The low dropout regulator of claim 16, wherein the capacitance of the second capacitor is greater than or equal to the capacitance of the first capacitor.

* * * * *